United States Patent [19]

Ho et al.

[11] Patent Number: 5,037,626

[45] Date of Patent: * Aug. 6, 1991

[54] PROCESS FOR PRODUCING SILICON CARBIDE WHISKERS USING SEEDING AGENT

[75] Inventors: Phillman N. Ho; Roy T. Coyle, both of Yorba Linda, Calif.

[73] Assignee: Union Oil Company of California, Los Angeles, Calif.

[*] Notice: The portion of the term of this patent subsequent to Jun. 13, 2006 has been disclaimed.

[21] Appl. No.: 275,329

[22] Filed: Nov. 22, 1988

[51] Int. Cl.$^5$ .............................................. G01B 31/36
[52] U.S. Cl. .................... 423/345; 423/344; 501/88
[58] Field of Search ............. 423/345; 427/344; 501/88

[56] References Cited

U.S. PATENT DOCUMENTS

| | | | |
|---|---|---|---|
| 3,085,863 | 4/1963 | Prener | 423/345 |
| 3,175,884 | 3/1965 | Kuhn | 423/345 |
| 3,319,785 | 5/1967 | Schroll | 423/345 |
| 3,379,647 | 4/1968 | Smudski | 423/345 |
| 3,754,076 | 8/1973 | Cutler | 423/345 |
| 3,778,296 | 12/1973 | Thalmann et al. | 427/249 |
| 4,248,844 | 2/1981 | Ramsey et al. | 423/345 |
| 4,283,375 | 8/1981 | Horne, Jr. et al. | 423/345 |
| 4,295,890 | 10/1981 | Stroke | 501/90 |
| 4,492,681 | 1/1985 | Endou et al. | 423/345 |
| 4,500,504 | 2/1985 | Yamamoto | 423/345 |
| 4,504,453 | 3/1985 | Tanaka et al. | 423/345 |
| 4,606,902 | 8/1986 | Ritter | 423/345 |
| 4,637,924 | 1/1987 | Beatty et al. | 423/345 |
| 4,690,811 | 9/1987 | Kida et al. | 423/345 |
| 4,702,901 | 10/1987 | Shalek | 423/346 |
| 4,839,150 | 6/1989 | Coyle et al. | 423/345 |
| 4,849,196 | 7/1989 | Yamada et al. | 423/345 |
| 4,873,069 | 10/1989 | Weaver et al. | 423/345 |

OTHER PUBLICATIONS

Patent Abstracts of Japan, "Production of SiC Whisker", vol. 12, No. 472, (C-551) [3319], Tokai Carbon Co., Ltd., Dec. 9, 1988.
Patent Abstracts of Japan, "Production of Silicon Carbide Whisker", vol. 10, No. 280, (C-374) [2338], Mitsui Toatsu Chem., Sep. 24, 1986.
M. A. Janney, G. C. Wei, C. R. Kennedy and L. A. Harris, "Carbothermal Synthesis of Silicon Carbide", Report ORNL-6169, Oak Ridge National Laboratory, Oak Ridge, Tennessee, May 1985.
B. K. Parekh and W. M. Goldberger, "Separation of Fine Size Silicon Carbide Whiskers from Coked Rice Hulls", *Mineral and Metallurigal Processing*, Nov. 1985, pp. 227-230.
K. S. Mazdiyasni and A. Zangvil, "Effect of Impurities on SiC Whisker Morphology", *J. Am. Ceram. Soc.*, vol. 68, No. 6, pp. C142-C-144, 1985.
J. V. Milewski, F. D. Gac, J. J. Petrovic and S. R. Skaggs, "Growth of Beta-Silicon Carbide Whiskers by the VLS Process", *J. Materials Science*, vol. 20, 1985, pp. 1160-1166.

*Primary Examiner*—Olik Chaudhuri
*Assistant Examiner*—Kenneth Horton
*Attorney, Agent, or Firm*—Yale S. Finkle; Gregory F. Wirzbicki

[57] ABSTRACT

A processing for producing silicon carbide whiskers in which a source of silica is mixed with a residual oil or crude petroleum and the resultant mixture is heated in a substantially nonoxidizing atmosphere at temperature sufficiently high to carbonize the residual oil or crude petroleum, thereby forming an intimate mixture of carbon and silica. The intimate mixture is then heated in a nonoxidizing atmosphere in the presence of a seeding component comprising an element selected from the group consisting of boron, the rare earths, Group IA, Group IB, Group VB, Group VIB, Group VIIB and Group VIII of the Periodic Table of Elements at temperatures sufficiently high to induce the reaction between carbon and silica to form silicon carbide. The resultant silicon carbide product will contain a relatively high concentration of silicon carbide whiskers.

38 Claims, 4 Drawing Sheets

PROCESS FOR PRODUCING SILICON CARBIDE WHISKERS USING SEEDING AGENT

BACKGROUND OF THE INVENTION

This invention relates to a process for making silicon carbide whiskers and is particularly concerned with a process for providing relatively high yields of beta silicon carbide whiskers.

Silicon carbide is a high strength ceramic material which has good chemical stability and excellent oxidation resistance to high temperatures due mainly to the fact that it is covalently bonded and has a crystal structure related to that of diamond. Silicon carbide whiskers are an elongated form of silicon carbide having an aspect ratio, i.e., a length-to-diameter ratio, greater than about 3 and a typical diameter between about 0.1 and 10 microns. The high aspect ratio of whiskers makes them a much more effective reinforcement in composites than silicon carbide particulates. Also, whiskers exhibit much higher mechanical strength than silicon carbide fibers, which are either polycrystalline or amorphous forms of silicon carbide that typically have a diameter greater than 10 microns. These superior properties of silicon carbide whiskers have led to their use as a reinforcing material for ceramics, metals, polymers and glass composites. Silicon carbide whiskers are particularly suited for use in the reinforcement of all types of engineering ceramics including gas turbine ceramics, automotive ceramics and ceramic cutting tools. It is estimated that the market for the use of whiskers as reinforcements for engineering ceramics alone will be several hundred million dollars per year by the year 2000.

The current dominant technology for producing silicon carbide whiskers is the carbothermal reduction of silica by carbon in rice hulls. Rice hulls are composed of about 15 to 20 percent ash that is primarily silica. Thus, when the rice hulls are retorted or pyrolyzed in an inert atmosphere at a temperature in the vicinity of 1800° C. while removing gases and other vapors as they form, carbon in the rice hulls reacts with silica to form silicon carbide in accordance with the overall reaction of $3C + SiO_2 = SiC + 2CO(g)$.

The major problem with using rice hulls to synthesize silicon carbide whiskers is that the resultant product normally contains only between about 10 and 20 weight percent silicon carbide whiskers with the remainder being silicon carbide in the form of particulates, unreacted silica and unreacted carbon. Higher yields of silicon carbide whiskers are usually not possible because the chemical composition of the rice hulls and the degree of mixing of the carbon and silica therein are set by nature and cannot readily be varied. Thus, it is difficult to obtain an intimate mixture of carbon and silica that is sufficiently porous to allow carbon monoxide gas to escape and thereby drive the overall reaction of carbon with silica to form silicon carbide to completion while allowing space for silicon carbide whiskers to grow.

Accordingly, it is one of the objects of the present invention to provide a process for producing silicon carbide in which the silica and carbon originate from different sources, which sources are chosen to obtain an intimate mixture which results in the more efficient production of greater amounts of silicon carbide whiskers. It is another object of the invention to provide a process in which the size and shape of the whiskers can be varied depending upon the ultimate application for the whiskers. These and other objects of the invention will become more apparent in view of the following description of the invention.

SUMMARY OF THE INVENTION

In accordance with the invention, it has now been found that high yields of silicon carbide whiskers can be obtained utilizing a residual oil or a crude petroleum as the carbon source, a separate source of silica and a seeding component containing an element selected from the group consisting of boron, the rare earths, Group IA, Group IB, Group VB, Group VIB, Group VIIB and Group VIII of the Periodic Table of Elements. The source of silica is mixed with the residual oil or crude petroleum and heated in a substantially nonoxidizing atmosphere at temperatures sufficient to carbonize the carbon source, usually between about 350° C. and 1200° C., and thereby form an intimate mixture of carbon and silica. The intimate mixture is then heated in a nonoxidizing atmosphere in the presence of the seeding component at temperatures typically above about 1200° C., which temperatures are sufficient to induce the reaction of carbon with silica to form a silicon carbide product which contains a relatively large proportion of silicon carbide whiskers.

The seeding component used in the high temperature heating or carbothermal reduction step serves to promote the formation of whiskers and usually contains an element or elements selected from the group consisting of lithium, potassium, sodium, rubidium, neodymium, niobium, vanadium, tantalum, chromium, molybdenum, manganese, iron, ruthenium, cobalt, rhodium, nickel, palladium, copper and boron. Preferably, the seeding component will contain cobalt, vanadium, iron, boron or nickel and will exist in the form of an oxylate, a carbonate, a carbide, a nitrate, an oxide, a borate, a silicate, a sulfate, a phosphide or a halide.

The process of the invention described above, by utilizing specific types of carbon sources and a seeding component containing certain specified elements to promote whisker growth, is much more efficient than the retorting of rice hulls in selectively producing silicon carbide whiskers. The use of a residual oil or crude petroleum as the source of carbon results in the formation of a highly porous, coke-like material when the mixture of the carbon source and the silica source is carbonized or coked at a temperature below about 1200° C. The resultant highly porous material, when heated in the presence of the seeding component at temperatures sufficiently above 1200° C. to induce the reaction of silica with carbon, yields a silicon carbide-containing product that frequently contains about twice the amount of silicon carbide whiskers generated by the prior art retorting of rice hulls. Furthermore, the diameter and shape of the whiskers may be controlled by varying the type of seeding component used.

DESCRIPTION OF THE INVENTION

Silicon carbide whiskers of desired diameter and shape are produced in accordance with the process of the invention by first mixing a source of silica, usually silica particles, with a residual oil or crude petroleum, typically in the absence of an added solvent which will dissolve both the silica particles and the residual oil or crude petroleum, to form a suspension of the silica particles in the residual oil or crude petroleum. Next, the mixture or suspension is heated in a substantially nonoxidizing atmosphere at temperatures sufficiently high to carbonize or coke the residual oil or crude petroleum and thereby form an intimate mixture of carbon and silica, i.e., a carbonized or coked dispersion comprising silica in a carbon matrix. Finally, the carbonized dispersion is heated in a substantially nonoxidizing atmosphere in the presence of a seeding component at temperatures sufficiently high, normally above about 1200° C., to induce the carbothermal reduction of silica by carbon to form silicon carbide. The seeding component used in the carbothermal reduction or high temperature heating step comprises an element selected from the group consisting of boron, the rare earths, Group IA, Group IB, Group VB, Group VIB, Group VIIB and Group VIII of the Periodic Table of Elements. As used herein "Periodic Table of Elements" refers to the version commonly used in the United States and approved by Chemical Abstracts (CAS). An example of such a table may be found on the inside front cover of the *CRC Handbook of Chemistry and Physics*, 69th edition, which was edited by R. C. Weast and was published in 1988 by CRC Press, Inc., Boca Raton, Fla. It has been found that the presence of the seeding component in the carbothermal reduction step of the process results in an increased production of silicon carbide whiskers as compared to that obtained by a similar process in which the seeding component is not used or by the prior art retorting of rice hulls. The process of the invention is an improvement over the process described in application Ser. No. 050,157 filed in the U.S. Patent and Trademark Office on May 15, 1987 and now U.S. Pat. No. 4,839,150, the disclosure of which application is hereby incorporated by reference in its entirety.

The silica source used in the process of the invention may be any crystalline or amorphous form of silicon dioxide or mixtures thereof. In addition, the source of silica may be a silica precursor, i.e., a compound or composition which contains silicon and which will be converted, upon heating, into silica. Examples of different types of silicon dioxide which may be used as the source of silica are high surface area materials commonly referred to as fumed silica, hydrated silica, dried silica sols, dried silica gels and silicic acid. These types of materials are usually amorphous and available in particles sizes as small as about 70 Angstroms in the case of fumed silica. Examples of silica precursors that may be used in the process of the invention include organic silicon compounds such as tetraethoxy and tetramethoxy orthosilicate. The use of silica having maximum particle sizes less than about 10 microns is preferred since the smaller particles generally react at a more rapid rate and also form more uniform, stable suspensions in residual oil or crude petroleum than larger particles.

In general, any type of crude petroleum may be used as a source of carbon in the process of the invention as long as it contains components boiling above about 350° C. Preferable crude petroleum will normally have an API gravity ranging between about 5° and about 25° and will have an initial boiling point above about 200° C. Examples of crude petroleum which may be employed in the process of the invention include Kuwait, Maya, Boscan and Hondo.

Residual oils suitable for use in the process of the invention not only include conventional petroleum-derived residual oils but residual oils derived from sources other than petroleum such as coal liquids, shale liquids, liquids derived from bitumen and the like. For purposes of the invention, "residual oils" normally include any mixture of hydrocarbons containing components boiling above about 350° C. and having a viscosity greater than about 1 centipoise at 25° C. Such residual oils do not include petroleum distillates and other lower boiling hydrocarbon mixtures that normally do not contain significant amounts of higher boiling components, i.e., components boiling above about 350° C., and therefore have a viscosity less than 1 centipoise at 25° C. In general, the residual oils used in the process of the invention contain greater than about 85 volume percent components boiling above about 350° C. and have a viscosity that ranges between about 1 and about $10^9$ centipoise, preferably between about 10 and about $10^7$ centipoise and more preferably between about 100 and 100,000 centipoise.

The preferred residual oils for use in the process of the invention include atmospheric petroleum residual oils, which usually have an initial boiling point above about 340° C., and vacuum petroleum residual oils, which typically have an initial boiling point above about 450° C. These petroleum residual oils are the heavier fractions which remain after the distillation of crude oil. These distillations are normally conducted at temperatures above about 80° C. and can be used to remove crude oil components having boiling points, at atmospheric pressure, up to about 560° C. Components boiling above about 350° C. are typically distilled under reduced pressure, since heavy crude oil components are subject to thermal cracking above that temperature. Continued distillation under reduced pressure and at increased temperatures would yield a residue known as pitch which does not have the desired fluid properties for use in the process of the invention.

It should be noted that hydrocarbon liquids which are not normally considered "residua" in a refinery can be used as a residual oil in the process of the invention. Such liquids may contain relatively low boiling components in combination with materials having atmospheric boiling points above about 350° C. Examples of such liquids include topped crude oil and mixtures of pitch and organic solvents in which the pitch can be dispersed or dissolved. Examples of such solvents include kerosene, benzene, ethylene glycol, and alcohols. Components of the residual oil which boil below about 350° C. will tend to distill away during the lower temperature or carbonization step of the process of the invention unless this step is conducted under pressure. Thus, the preferred residual oils for use in the process of the invention are those which have an initial boiling point above about 350° C. at atmospheric pressure.

In carrying out the process of the invention, the silica source and residual oil or crude petroleum are intimately mixed in such a manner that particles of silica form a colloidal suspension in the residual oil or crude petroleum. In cases where the silica source is a silica precursor, the suspension will form when the mixture is subjected to heating. After the suspension is formed, it is heated at temperatures between about 350° C. and 1200° C., preferably between about 450° C. and 750° C., and most preferably between about 550° C. and about 650° C., in a substantially nonoxidizing atmosphere such that the residual oil or crude petroleum is carbonized, i.e., the carbon-containing compounds comprising the residual oil or crude petróleum are either converted into carbon or coke or volatilized. The resultant carbonized dispersion or coke-like mixture of carbon and silica will have a relatively high surface area, usually ranging between about 50 and about 200 $m^2$/gram, and will comprise a highly porous carbon matrix in which silica is fixed throughout and in intimate contact with the carbon. If hydrocarbons or mixtures thereof less dense than residual oils are used in the process, carbonization at atmospheric pressure will result in loss of a relatively large proportion of the carbon source and a resultant carbonized dispersion that tends to be much less porous as indicated by a surface area less than about 50 $m^2$/gram.

Typically, sufficient amounts of the residual oil or crude petroleum and the silica source are utilized so that, when the mixture is carbonized, the carbon-to-silicon mole ratio in the carbonized dispersion ranges between about 0.1 and 100, preferably between about 1 and about 20, and most preferably between about 2 and about 5. It is normally preferred that an excess amount of the carbon source be utilized so that the silicon carbide product will contain unreacted carbon.

The heating or carbonization step can be carried out in either a batch-type or continuous operation by either placing the mixture of the silica source and residual oil or crude petroleum in, or passing the mixture through, a suitable temperature-resistant heating chamber and heating the mixture at a temperature and for a time sufficient to produce a carbonized dispersion of silica particles in carbon. The time required to carbonize the residual oil or crude petroleum will vary depending upon the heating chamber geometry and the temperature utilized. As mentioned previously, the temperature will normally range between about 350° C. and about 1200° C. but is preferably below the temperature at which silica reacts with carbon to form silicon carbide.

The mixture of the silica source and residual oil or crude petroleum is normally heated in a substantially nonoxidizing atmosphere which typically comprises nitrogen or argon but may contain a reducing gas, such as hydrogen or carbon monoxide, or gases with a higher oxidation potential, such as carbon dioxide, steam or oxygen-depleted air. Usually, the atmosphere will contain less than about 0.10 volume percent oxygen, preferably less than about 0.01 volume percent. Although the gaseous atmosphere in the heating chamber may be static, it is preferred that the atmosphere flow through the chamber to remove gases and volatile organic compounds released by the residual oil or crude petroleum during the carbonization step. The heating or carbonization step is normally carried out at atmospheric pressure but, depending upon the characteristics of the residual oil or crude petroleum used as the carbon source, may be conducted in a vacuum or under pressure.

It has been found that a relatively high yield of silicon carbide whiskers is obtained when the highly porous, coke-like mixture of silica particles and carbon exiting the carbonization step is heated in the presence of a seeding component containing a certain element or elements at temperatures sufficiently high to induce the reaction of silica with carbon. The seeding component utilized will typically contain an element or elements selected from the group consisting of boron, the rare earths, Group IA, Group IB, Group VB, Group VIB, Group VIIB and Group VIII of the Periodic Table of Elements. Preferably, the seeding component will contain lithium, potassium, sodium, rubidium, neodymium, niobium, vanadium, tantalum, chromium, molybdenum, manganese, iron, ruthenium, cobalt, rhodium, nickel, palladium, copper or boron. The seeding component can be mixed with or impregnated onto the particles of the carbonized dispersion prior to the carbothermal reduction step or it may be added to the residual oil or crude petroleum so that it is incorporated into the carbonized dispersion during the carbonization step.

The seeding component used is normally in the form of a compound or mixtures of compounds containing the desired element or elements. Although any anion can be chemically combined with the desired element or elements, the seeding component is typically in the form of an oxylate, a carbonate, a carbide, a nitrate, an oxide, a boride, a silicate, a sulfate, a phosphide or a halide. In general, a sufficient amount of the seeding component is used such that the mole ratio of the desired element in the seeding material to the silicon present in the carbonized dispersion is between about 0.001 and 10.0, preferably between about 0.005 and 5.0 and most preferably between about 0.01 and 2.0. It has been found that the use of cobalt, iron, nickel, boron and vanadium as a constituent of the seeding component is particularly effective in increasing the yield of silicon carbide whiskers. These elements are preferably used in the form of a carbonate, carbide or nitrate.

After the mixture of the carbonized dispersion and seeding component is formed, it is subjected to temperatures sufficiently high to cause the silica particles to react with the carbon present in the dispersion and thereby form silicon carbide via the carbothermal reduction of silica by carbon. These temperatures are typically above 1200° C. and usually range between about 1300° C. and 2000° C., preferably between about 1400° C. and about 1800° C. The higher the temperature, the more rapid is the formation of silicon carbide. However, at temperatures above about 2000° C., silicon carbide is transformed from the beta to alpha crystal form. Thus, temperatures of this magnitude should be avoided when attempting to produce silicon carbide whiskers having the beta crystal structure.

The high temperature or carbothermal reduction step, like the carbonization step, may be carried out in either a batch-type or continuous operation normally in the presence of a substantially nonoxidizing atmosphere similar to the one used in the carbonization step. Preferably, a flowing gas atmosphere is utilized to remove product carbon monoxide which, if present in high concentrations, would shift the reaction equilibrium away from the formation of silicon carbide. Normally, this high temperature carbothermal reduction step is carried out at atmospheric pressure. If a batch-type operation is preferred, the mixture of the carbonized dispersion and seeding component may be heated inside a graphite container in an induction or resistance furnace. Alternatively, if a continuous operation is desired, the mixture may be passed through a rotary kiln or similar high temperature heating device.

It has been found that the presence of the seeding component in the high temperature carbothermal reduction step results in a yield of silicon carbide whiskers which is approximately two times greater than the yield obtained utilizing the conventional process of pyrolyzing rice hulls. It has also been found that the product of the carbothermal reduction step can be effectively used itself as a seeding material without any further processing. It is theorized that the unprocessed product is an effective seeding material because it contains at least a portion of the seeding component introduced into the carbothermal reduction step and/or because the original seeding component reacted with carbon in the carbothermal reduction step to form another type of seeding component. The latter theory is supported by the finding that, if a seeding component is mixed with a residual oil or crude petroleum without the presence of a silica source and the resultant mixture is submitted to the relatively low temperature carbonization and high temperature carbothermal reduction steps of the process of the invention, the resultant product is an effective seeding agent for use in producing silicon carbide whiskers in accordance with the process of the invention.

In addition to silicon carbide whiskers of various sizes and shapes, the product formed in the high temperature heating or carbothermal reduction step will, depending upon which of the reactants is initially present in a stoichiometric excess and whether the reaction proceeds to completion, contain silicon carbide particulates, unreacted seeding component, unreacted silica and unreacted carbon. This product is typically treated to separate the unreacted components from the silicon carbide whiskers and particulates using methods such as froth flotation, density separations and chemical reactions. A suitable flotation method for removing these unreacted materials is described in U.S. Pat. No. 3,319,785, the disclosure of which is hereby incorporated by reference in its entirety. Methods for density separation include the use of liquids having specific gravities intermediate to those of silicon carbide (sp. gr. 3.217) and the much less dense unreacted seeding component, silica and carbon. Chemically, silica can be dissolved from the mixture using hydrofluoric acid solutions while carbon can be preferentially oxidized to form gaseous products at moderate temperatures usually ranging between about 500° C. and about 700° C. in an oxygen-containing atmosphere. These chemical procedures will generally yield a high purity silicon carbide product.

After unreacted carbon, silica, seeding component and other impurities have been removed from the product of the carbothermal reduction step, a mixture of silicon carbide whiskers and silicon carbide particulates will remain. The diameter of the whiskers present is normally less than about 20 microns and typically ranges between about 0.10 microns and about 15 microns. The whisker's lengths normally range between about 10 and 50 times that of the diameter. The particulates range in size from the submicron range to a few hundred microns. Typically, 30 to 50 weight percent of the silicon carbide particulates present will have a diameter greater than about 20 microns while 5 to 15 weight percent will have a diameter smaller than about 1 micron. Since the most preferable size for silicon carbide whiskers typically ranges between about 0.1 micron and about 20 microns, it is normally desirable to remove the particulates and whiskers having sizes outside this range from the product. This can be accomplished by using air classification methods widely employed in the chemical processing industry for classifying solid particles.

Besides significantly increasing the yield of silicon carbide whiskers, it has been found that the type of seeding component used can result in variations in the diameter and shape of the resultant whiskers. For example, the use of a seeding component containing cobalt has been found to produce whiskers having a twisted rod shape, a diameter between about 1 and 5 microns and lengths such that the aspect ratio, the ratio of the length to the diameter, is about 10. A seeding component containing vanadium also produces whiskers having a twisted rod shape and an aspect ratio of about 10 but with diameters between about 0.5 and 2 microns. The use of a boron-containing seeding component, on the other hand, usually results in straight whiskers having a diameter between about 0.2 and about 0.8 microns. Recent studies indicate that the most desirable whisker sizes for use in ceramic composites are those which have a diameter between about 2 and about 10 microns. Thus, cobalt appears to be one of the more preferable elements for use as a constituent of the seeding component when whiskers for reinforcing ceramics are desired.

The nature and objects of the invention are further illustrated by the following examples, which are provided for illustrative purposes only and not to limit the invention as defined by the claims. The examples indicate that seeding compounds containing copper, rubidium, potassium, neodymium, boron, vanadium, nickel, iron, cobalt, chromium and manganese can effectively promote the selective formation of silicon carbide whiskers in a two-step process wherein silica particles are suspended in a residual oil to form a mixture which is first carbonized and the resultant coke-like dispersion of silica in carbon is then heated at higher temperatures in the presence of the seeding compound to induce the reaction between carbon and silica to form silicon carbide. The examples further indicate that the seeding compound is effective whether it is added to the original suspension of silica particles in residual oil or mixed with the carbonized dispersion just prior to the silicon carbide synthesis step.

EXAMPLE 1

Figure 1:
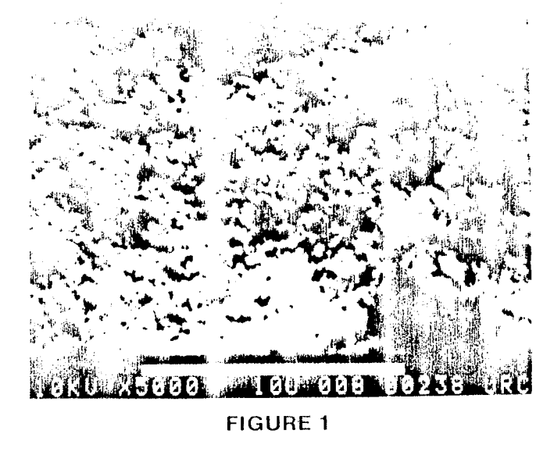
FIG. 1 in the drawing is a scanning electron photomicrograph, at 5000 times magnification, of the product formed in Example 1 illustrating that essentially no silicon carbide whiskers are formed.

Silicon carbide whiskers were synthesized as described below. Nine hundred and thirty one grams of Hi-Sil T-600 hydrated colloidal silica particles supplied by PPG Industries, Inc. were suspended by use of a muller in a mixture of 28 grams of boric oxide ($B_2O_3$) and 5574 grams of an atmospheric residual oil produced by removing hydrocarbons boiling below about 350° C. from a Kuwait crude oil. The colloidal silica contained 13 percent water and had an average particle size of about 21 nanometers and a surface area of about 150 $m^2$/gram. The suspension was heated in a box furnace under a nitrogen purge of 283 l/hr. at a heating rate of about 315° C. per hour to about 650° C. where it was held for 2 hours. The furnace was then turned off and the contents allowed to cool to room temperature overnight. The resulting product was a porous, low density mass of silica particles dispersed in a carbon matrix. This carbonized dispersion, which had carbon-to-silicon and boron-to-silicon mole ratios of about 3.3 and 0.05, respectively, was crushed in a muller to a powder form. Approximately 1.5 grams of the coke-like powder was then placed into a graphite crucible and heated to about 1500° C. in a resistance furnace in a flowing argon atmosphere. The furnace was held at 1500° C. for about 3.1 hours at which temperature the carbon reacted with the silica to form silicon carbide. The resultant silicon carbide-containing product was cooled at a rate of about 250° C. per hour to room temperature. The cooled product in the form of a cake-like material was removed from the crucible and crushed. A scanning electron photomicrograph of a portion of the product is shown in FIG. 1. As can be seen, the silicon carbide is primarily in the form of particulates. There is no evidence of whiskers at the 5000 times magnification used.

EXAMPLE 2

Figure 2:
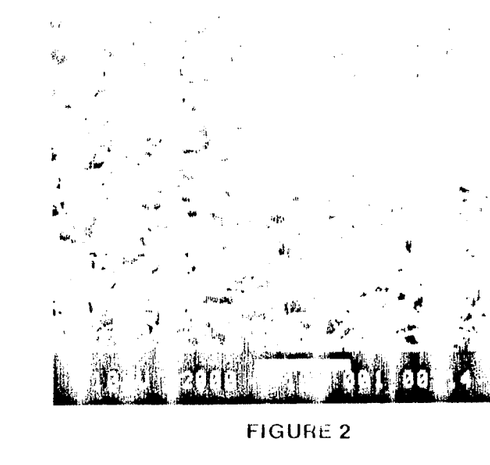
FIG. 2 is a scanning electron photomicrograph, at 2000 times magnification, of the product formed in Example 2 illustrating the formation of silicon carbide whiskers when a cupric nitrate seeding component is used.

The procedure of Example 1 was followed except that 1.5 grams of the carbon-silica, coke-like powder from the initial heating or carbonization step was mixed with 0.20 grams of cupric nitrate ($Cu(NO_3)_2 \cdot 3H_2O$) prior to being heated at high temperatures in the resistance furnace. The mole ratio of copper-to-silicon present in the mixture was 0.06. A scanning electron photomicrograph of the resultant product at 2000 times magnification is shown in FIG. 2 and indicates that silicon carbide whiskers were formed.

EXAMPLE 3

Figure 3:
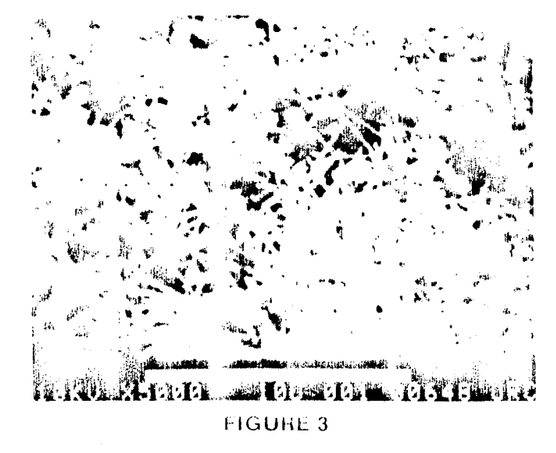
FIG. 3 is a scanning electron photomicrograph, at 5000 times magnification, of the product formed in Example 3 illustrating the formation of silicon carbide whiskers when a rubidium nitrate seeding component is used.

The procedure of Example 1 was followed except that 1.5 grams of the carbon-silica, coke-like powder from the initial heating step was mixed with 0.3 grams of rubidium nitrate ($RbNO_3$) and 0.3 grams of charcoal before being subjected to the high temperature heating step in the resistance furnace. The mole ratio of rubidium-to-silicon in the mixture was 0.14. A scanning electron photomicrograph of the resultant product at 5000 times magnification is set forth in FIG. 3 and shows the presence of silicon carbide whiskers having relatively small diameters.

EXAMPLE 4

Figure 4:
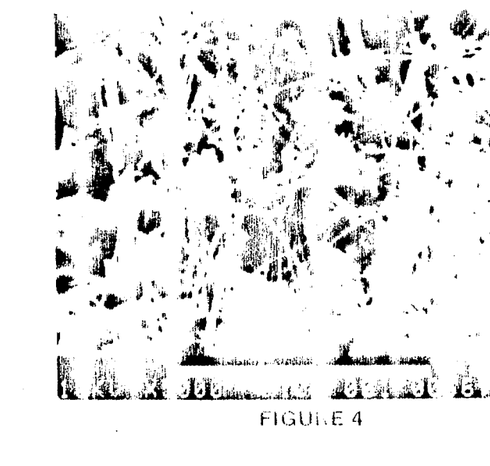
FIG. 4 is a scanning electron photomicrograph, at 5000 times magnification, of the product formed in Example 4 illustrating the formation of silicon carbide whiskers when a potassium nitrate seeding component is used.

The procedure of Example 1 was followed except that 1.5 grams of the carbon-silica, coke-like powder from the initial heating step was mixed with 0.3 grams of potassium nitrate ($KNO_3$) prior to being subjected to the high temperature heating step in the resistance furnace. The mole ratio of potassium-to-silicon in the mixture was 0.21. A scanning electron photomicrograph of the resultant product at 5000 times magnification is shown in FIG. 4 and indicates the presence of silicon carbide whiskers having various diameters and lengths.

EXAMPLE 5

Figure 5:
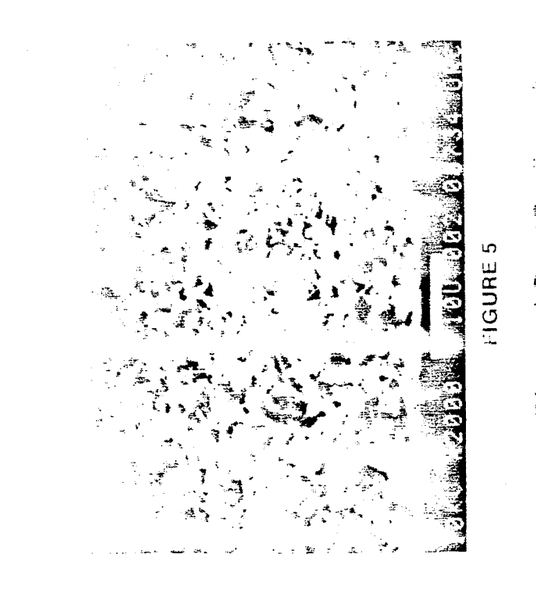
FIG. 5 is a scanning electron photomicrograph, at 2000 times magnification, of the product produced in Example 5 illustrating the formation of silicon carbide whiskers when a neodymium nitrate seeding component is used.

The procedure of Example 1 was followed except that 1.5 grams of the carbon-silica, coke-like powder from the initial heating step was mixed with 0.3 grams of neodymium nitrate ($Nd(NO_3)_3 \cdot 6H_2O$) prior to being heated to a high temperature in the resistance furnace. The mole ratio of neodymium-to-silicon in the mixture was 0.05. A scanning electron photomicrograph of the resultant product at 2000 times magnification is shown in FIG. 5 and indicates the presence of silicon carbide whiskers.

EXAMPLE 6

Figure 6:
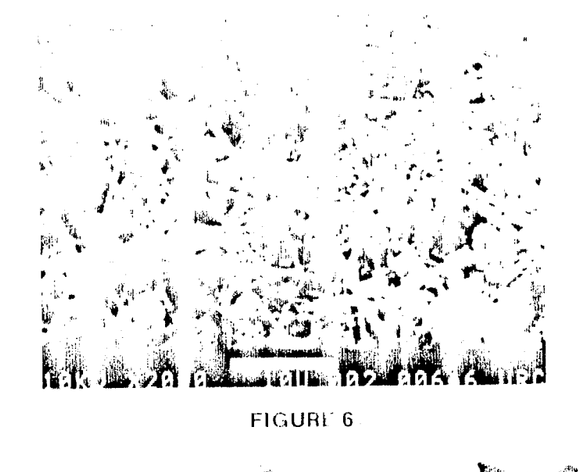
FIG. 6 is a scanning electron photomicrograph, at 2000 times magnification, of the product formed in Example 6 illustrating the formation of silicon carbide whiskers when a boron carbide seeding component is used.

The procedure of Example 1 was followed except that 1.5 grams of the carbon-silica, coke-like powder from the initial heating step was mixed with 0.4 grams of milled boron carbide ($B_4C$) prior to being subjected to the high temperature heating step in the resistance furnace. The mixture had a mole ratio of boron-to-silicon equal to 2.10. A scanning electron photomicrograph of the resultant product at 2000 times magnification is shown in FIG. 6 and indicates the presence of straight silicon carbide whiskers.

FIG. 1, the photomicrograph of the product formed in Example 1, indicates that essentially no silicon carbide whiskers were formed when a sufficient amount of $B_2O_3$ was added to the initial mixture of silica and residual oil to give a boron-to-silicon mole ratio equal to 0.05. The photomicrograph from Example 6 shows the presence of such whiskers when $B_4C$ was added to the coke-like powder from the initial heating step in amounts that yield a boron-to-silicon mole ratio of 2.10. It is believed the difference in results is due to the much higher concentration of boron present in Example 6 rather than the fact that the boron in Example 1 was in the form of $B_2O_3$ and was added directly to the initial mixture of silica and residual oil and not to the coke-like product of the initial heating step.

EXAMPLE 7

Figure 7:
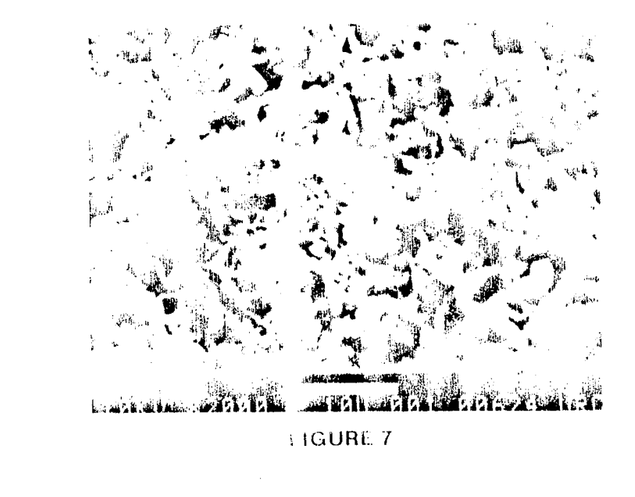
FIG. 7 is a scanning electron photomicrograph, at 2000 times magnification, of the product produced in Example 7 illustrating the formation of silicon carbide whiskers when a vanadium carbide seeding component is used.

A carbon-silica, coke-like powder was made as described in Example 1 except that the mixture heated in the box furnace was prepared by suspending 368 grams of Hi-Sil T-600 hydrated colloidal silica particles in a mixture of 2209 grams of Kuwait atmospheric residual oil and 0.11 grams of $B_2O_3$. The powder had carbon-to-silicon and boron-to-silicon mole ratios of 3.3 and 0.0006, respectively. Approximately 1.5 grams of the coke-like powder was mixed with 0.31 grams of vanadium carbide (VC) and the resultant mixture was heated to high temperatures in a resistance furnace as described in Example 1. The mole ratio of vanadium-to-silicon in the mixture subjected to heating was 0.34. A scanning electron photomicrograph of the resultant product at 2000 times magnification is set forth in FIG. 7 and shows the presence of silicon carbide whiskers having an average diameter of about 1.0 micron.

EXAMPLE 8

Figure 8:
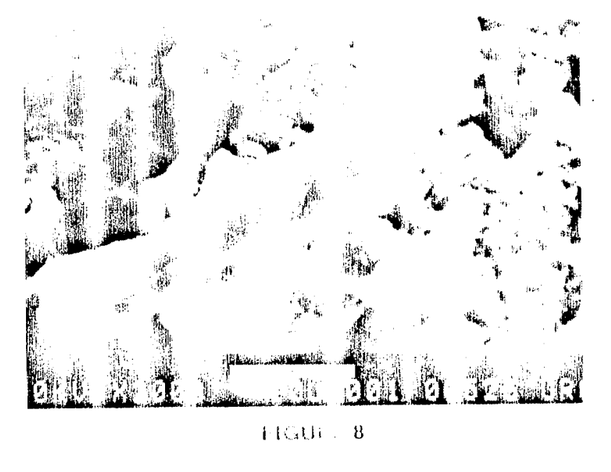
FIG. 8 is a scanning electron photomicrograph, at 2000 times magnification, of the product produced in Example 8 illustrating the formation of silicon carbide whiskers when a nickel nitrate seeding component is used.

The procedure of Example 7 was followed except that 1.5 grams of the carbon-silica, coke-like powder from the initial heating step was mixed with 0.31 grams of nickel nitrate ($Ni(NO_3)_2 \cdot 6H_2O$) prior to being subjected to the high temperature heating step in the resistance furnace. The mole ratio of nickel-to-silicon in the mixture was 0.07. A scanning electron photomicrograph of the resultant product at 2000 times magnification is shown in FIG. 8 and indicates the presence of silicon carbide whiskers in the shape of twisted rods.

EXAMPLE 9

Figure 9:
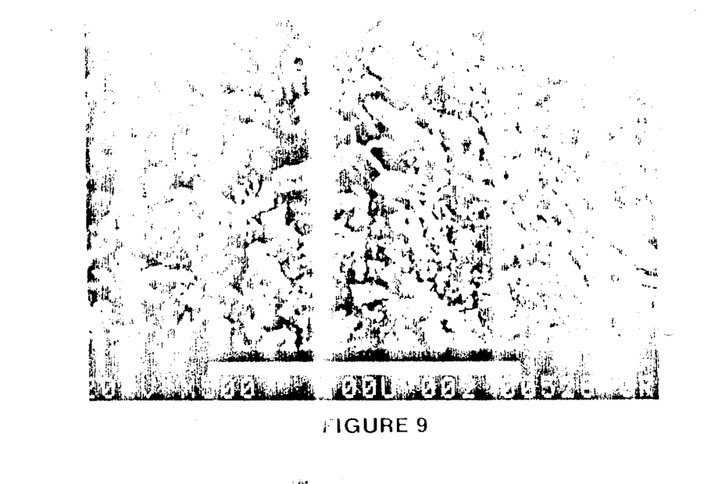
FIG. 9 is a scanning electron photomicrograph, at 500 times magnification, of the product produced in Example 9 illustrating the formation of silicon carbide whiskers when a ferric nitrate seeding component is used.

The procedure of Example 7 was followed except that 1.5 grams of the carbon-silica, coke-like powder from the initial heating step was mixed with 0.31 grams of ferric nitrate ($Fe(NO_3)_3 \cdot 9H_2O$) prior to being subjected to the high temperature heating step in the resistance furnace. The mole ratio of iron-to-silicon in the mixture was 0.05. A scanning electron photomicrograph of the resultant silicon carbide product at 500 times magnification is shown in FIG. 9. As can be seen from the figure, silicon carbide whiskers approaching 10 microns in diameter were present.

EXAMPLE 10

Figure 10:
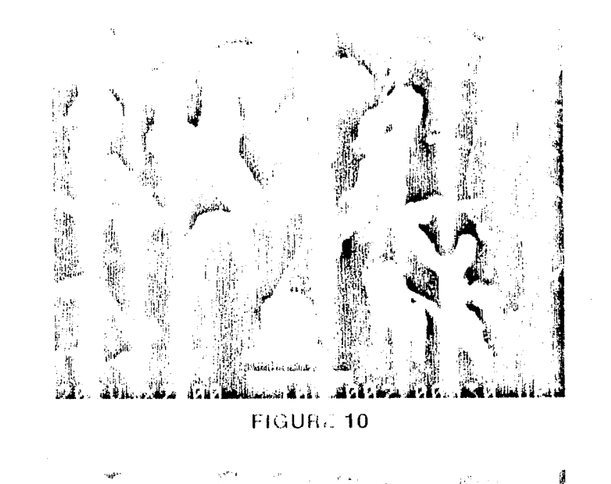
FIG. 10 is a scanning electron photomicrograph, at 2000 times magnification, of the product formed in Example 10 illustrating the formation of silicon carbide whiskers when a cobalt carbonate seeding component is used.

The procedure of Example 7 was followed except that 1.5 grams of the carbon-silica, coke-like powder from the initial heating step was mixed with 0.31 grams of cobalt carbonate ($CoCO_3$) to form a mixture having a cobalt-to-silicon mole ratio of 0.18 prior to being subjected to the high temperature heating step in the resistance furnace. Unlike in Example 7, however, the product from the resistance furnace was heated in the presence of air at 550° C. overnight to remove unreacted carbon and then treated with a 37 weight percent hydrofluoric acid solution to remove unreacted silica. A scanning electron photomicrograph of the resultant silicon carbide product at 2000 times magnification is shown in FIG. 10. As can be seen, silicon carbide whiskers up to about 5 microns in diameter were present.

EXAMPLE 11

Figure 11:
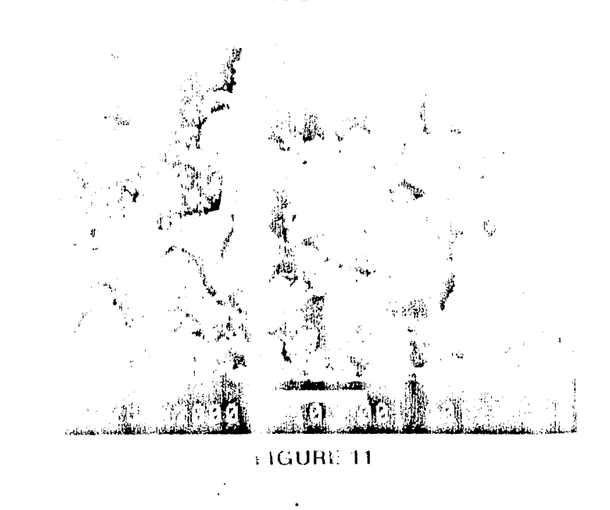
FIG. 11 is a scanning electron photomicrograph, at 2000 times magnification, of the product formed in Example 11 illustrating the formation of silicon carbide whiskers when a chromic oxide seeding component is used.

A carbon-silica, coke-like powder was made as described in Example 1 except that the mixture heated in the box furnace was prepared by suspending 7.0 grams of Hi-Sil T-600 hydrated colloidal silica particles in a mixture of 0.9 grams of chromic oxide ($Cr_2O_3$) and 42.1 grams of Kuwait atmospheric residual oil. No $B_2O_3$ was added. The coke-like powder had carbon-to-silicon and chromium-to-silicon mole ratios of 3.3 and 0.11, respectively. About 1.5 grams of the coke-like powder was heated to high temperatures in a resistance furnace as described in Example 1. A scanning electron photomicrograph of the resultant product at 2000 times magnification is shown in FIG. 11 and indicates the presence of silicon carbide whiskers.

EXAMPLE 12

Figure 12:
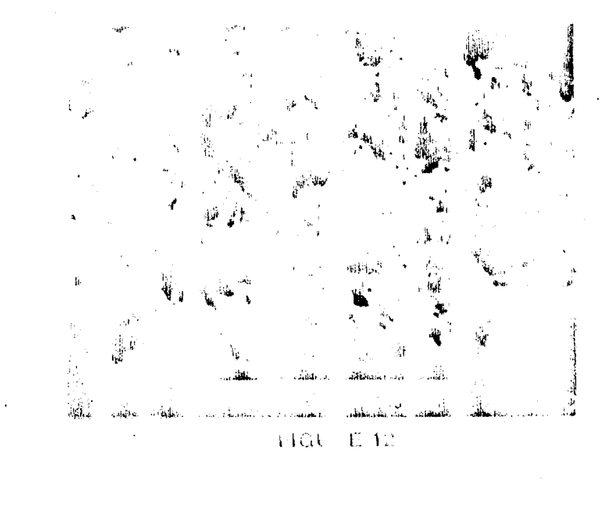
FIG. 12 is a scanning electron photomicrograph, at 5000 times magnification, of the product formed in Example 12 illustrating the formation of silicon carbide whiskers when a manganous oxide seeding component is used.

The procedure of Example 11 was followed except that the suspension heated in the box furnace was prepared using 0.4 grams of manganous oxide (MnO) instead of 0.9 grams of $Cr_2O_3$, 42.8 grams of residual oil and 7.2 grams of hydrated colloidal silica particles. The carbon-silica, coke-like powder from the initial heating step had carbon-to-silicon and manganese-to-silicon ratios of 2.5 and 0.054, respectively. Unlike in Example 11, however, the product from the resistance furnace was heated in air at 550° C. overnight to remove unreacted carbon and then treated with a 37 weight percent hydrofluoric acid solution to remove unreacted silica. A scanning electron photomicrograph of the resultant product at 5000 times magnification is shown in FIG. 12 and indicates the presence of silicon carbide whiskers having various diameters.

EXAMPLE 13

Figure 13:
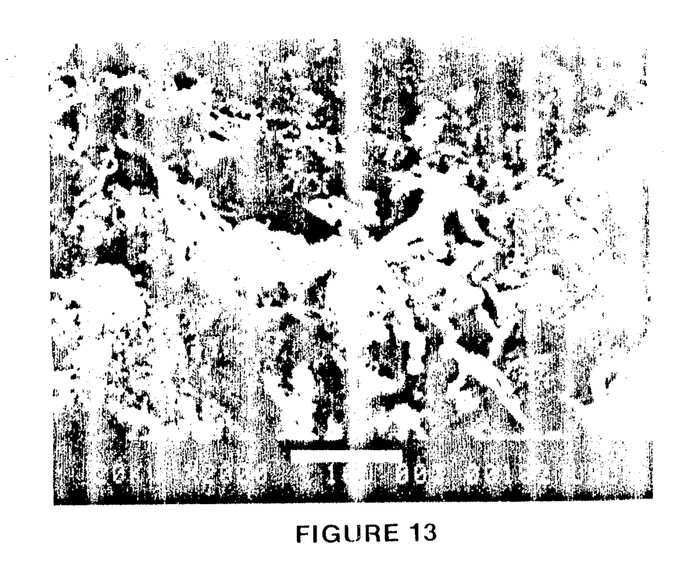
FIG. 13 is a scanning electron photomicrograph, at 2000 times magnification, of the product formed in Example 13 illustrating the formation of silicon carbide whiskers when a vanadium oxide seeding component is used.

The procedure of Example 11 was followed except 0.2 grams of vanadium oxide ($V_2O_5$) was used to form the suspension instead of 0.9 grams of $Cr_2O_3$. The mole ratio of vanadium-to-silicon in the coke-like product subjected to the high temperature heating step in the resistance furnace was 0.02. A scanning electron photomicrograph of the final product at 2000 times magnification is set forth in FIG. 13 and shows the presence of silicon carbide whiskers. This example illustrates that whiskers can be formed using much smaller concentration of vanadium than used in Example 7.

EXAMPLE 14

Figure 14:
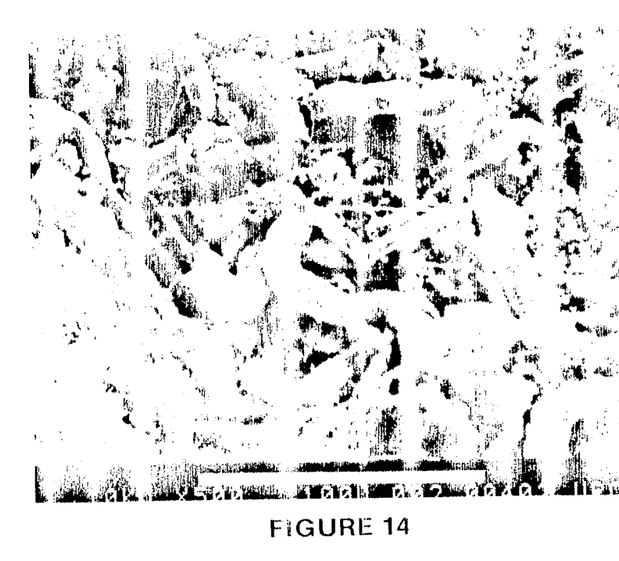
FIG. 14 is a scanning electron photomicrograph, at 500 times magnification, of the product formed in Example 14 illustrating the formation of silicon carbide whiskers when a cobalt nitrate seeding component is used.

A carbon-silica, coke-like powder was made as described in Example 1 except the suspension heated in the box furnace was prepared by mixing 195 grams of Hi-Sil T-600 hydrated colloidal silica particles with 1168 grams of Kuwait atmospheric residual oil and 6.0 grams of $B_2O_3$. The powder had carbon-to-silicon and boron-to-silicon mole ratios of 3.3 and 0.06, respectively. About 1.35 grams of the coke-like powder was mixed with 0.15 grams of cobalt nitrate ($Co(NO_3)_2 \cdot 6H_2O$) and the resultant mixture was heated to high temperatures in a resistance furnace as described in Example 1. The mole ratio of cobalt-to-silicon in the mixture subjected to heating in the resistance furnace was 0.04. A scanning electron photomicrograph of the resultant product at 500 times magnification is set forth in FIG. 14 and shows the presence of silicon carbide whiskers having diameters up to 5.0 microns. This example illustrates that whiskers can be formed at much smaller concentrations of cobalt than used in Example 10.

EXAMPLE 15

A silicon carbide-containing product was synthesized in accordance with procedures similar to those described in Example 10. The product was processed to remove unreacted carbon, silica and cobalt. The resultant clean silicon carbide was then wet sieved to remove large particulates and treated by sedimentation in water to remove material smaller than about 1 micron in diameter. A representative sample of the remaining material was photographed at 400 times magnification with a scanning electron microscope. An analysis of the resulting photomicrograph indicated that the sample contained silicon carbide whiskers ranging from 1 to 5 microns in diameter. The characteristic whisker dimension was estimated to be about 3 microns in diameter and 30 microns long. The whiskers were estimated to comprise from 20 to 40 weight percent of the sample. The sample also contained particulates ranging in diameter from about several microns to about 50 microns.

Although this invention has been primarily described in conjunction with examples and by reference to embodiments thereof, it is evident that many alternatives, modifications and variations will be apparent to those skilled in the art in light of the foregoing description. Accordingly, it is intended to embrace within the invention all such alternatives, modifications and variations that fall within the spirit and scope of the appended claims.

We claim:

1. A process for producing silicon carbide whiskers which comprises:
   (a) mixing a source of carbon selected from the group consisting of residual oils and crude petroleum with a source of silica;
   (b) heating said mixture of said silica source and said carbon source in a substantially nonoxidizing atmosphere at temperatures sufficient to carbonize the carbon source and thereby form an intimate mixture of carbon and silica;
   (c) heating said intimate mixture of carbon and silica in a nonoxidizing atmosphere in the presence of a seeding component comprising an element selected from the group consisting of boron, the rare earths, Group IA, Group IB, Group VB, Group VIB, Group VIIB and Group VIII of the Periodic Table of Elements at temperatures sufficient to induce a reaction between said carbon and said silica to form silicon carbide; and
   (d) recovering a product containing silicon carbide whiskers.

2. A process as defined by claim 1 wherein said carbon source comprises a residual oil.

3. A process as defined by claim 1 wherein said carbon source comprises a crude petroleum.

4. A process as defined by claim 2 wherein said residual oil is an atmospheric petroleum residual oil.

5. A process as defined by claim 2 wherein said residual oil is a vacuum petroleum residual oil.

6. A process as defined by claim 2 wherein said residual oil contains components boiling above about 350° C. and has a viscosity greater than about 1.0 centipoise at 25° C.

7. A process as defined by claim 6 wherein said residual oil is selected from the group consisting of petroleum residual oils, oil shale liquids, coal liquids and liquids derived from tar sands.

8. A process as defined by claim 2 wherein said residual oil comprises a petroleum residual oil having an initial boiling point at atmospheric pressure above about 200° C.

9. A process as defined by claim 2 wherein said residual oil comprises a petroleum residual oil having an initial boiling point at atmospheric pressure above about 350° C.

10. A process as defined by claim 2 wherein said residual oil is produced by removing components boiling below about 560° C. at atmospheric pressure from a crude petroleum.

11. A process as defined by claim 1 wherein said silica source is selected from the group consisting of silica, fumed silica, hydrated silica, dried silica gel, dried silica sol and organic silicon compounds.

12. A process as defined by claim 1 wherein said silica source yields silica particles having a size less than about 10 microns.

13. A process as defined by claim 1 wherein the heating in step (b) is carried out at a temperature below that at which silica and carbon react to form silicon carbide.

14. A process as defined by claim 1 wherein said seeding component comprises an element selected from the group consisting of lithium, potassium, sodium, rubidium, neodymium, niobium, vanadium, tantalum, chromium, molybdenum, manganese, iron, ruthenium, cobalt, rhodium, nickel, palladium, copper, and boron.

15. A process as defined by claim 14 wherein said seeding component comprises an element selected from the group consisting of cobalt, vanadium, iron, boron and nickel.

16. A process as defined by claim 15 wherein said element is cobalt.

17. A process as defined by claim 15 wherein said element is vanadium.

18. A process as defined by claim 1 wherein a sufficient amount of said seeding component is present in step (c) such that the mole ratio of said element to the silicon present ranges between about 0.01 and about 2.0.

19. A process as defined by claim 1 wherein said seeding component is incorporated into the carbon source in step (a).

20. A process as defined by claim 1 wherein said seeding component is mixed with the intimate mixture of carbon and silica formed in step (b).

21. A process as defined by claim 1 wherein said seeding component is in the form of an oxylate, a carbonate, a carbide, a nitrate, an oxide, a boride, a silicate, a sulfate, a phosphide or a halide.

22. A process as defined by claim 1 wherein a portion of the product recovered in step (d) of said process comprises said seeding component.

23. A process for producing silicon carbide whiskers which comprises:
   (a) suspending particles of silica in a petroleum residual oil;
   (b) heating said suspension of silica particles in said residual oil in a substantially nonoxidizing atmosphere at temperatures below about 1200° C. but sufficiently high to carbonize the residual oil and thereby form an intimate mixture of carbon and silica;

(c) heating said intimate mixture of carbon and silica in a nonoxidizing atmosphere in the presence of a seeding component comprising an element selected from the group consisting of lithium, potassium, sodium, rubidium, neodymium, niobium, tantalum, boron, cobalt, vanadium, iron, nickel, chromium, molybdenum, manganese, ruthenium, rhodium, palladium and copper at temperatures sufficiently above about 1200° C. to induce the reaction between carbon and silica to form silicon carbide; and (d) recovering a product containing silicon carbide whiskers.

24. A process as defined by claim 23 wherein said element is cobalt.

25. A process as defined by claim 23 wherein said element is vanadium.

26. A process as defined by claim 23 wherein said element is iron.

27. A process as defined by claim 23 wherein said element is boron.

28. A process as defined by claim 23 wherein said element is nickel.

29. A process as defined by claim 23 wherein said seeding component is vanadium carbide.

30. A process as defined by claim 23 wherein said seeding component is vanadium oxide.

31. A process as defined by claim 23 wherein said seeding component is cobalt carbonate.

32. A process as defined by claim 23 wherein said seeding component is cobalt nitrate.

33. A process as defined by claim 23 wherein said residual oil is produced by removing components boiling below about 350° C. at atmospheric pressure from a crude petroleum.

34. A process as defined by claim 23 wherein step (b) is carried out at a temperature between about 500° C. and about 750° C.

35. A process as defined by claim 23 wherein step (c) is carried out at a temperature between about 1300° C. and about 2000° C.

36. A process as defined by claim 23 wherein said silica particles are suspended in said residual oil in the absence of an added solvent which will dissolve both the silica particles and the residual oil.

37. A process as defined by claim 23 wherein said seeding component is boric oxide.

38. A process as defined by claim 23 wherein said seeding component is boron carbide.

* * * * *